United States Patent [19]
Horiuchi et al.

[11] Patent Number: 5,602,059
[45] Date of Patent: Feb. 11, 1997

[54] SEMICONDUCTOR DEVICE AND METHOD FOR MANUFACTURING SAME

[75] Inventors: Michio Horiuchi; Yoichi Harayama, both of Nagano, Japan

[73] Assignee: Shinko Electric Industries Co., Ltd., Nagano, Japan

[21] Appl. No.: 525,078

[22] Filed: Sep. 8, 1995

[30] Foreign Application Priority Data

Sep. 8, 1994 [JP] Japan ................................ 6-214428

[51] Int. Cl.$^6$ .................................................. H01L 21/60
[52] U.S. Cl. ........................ 437/209; 437/211; 437/214; 437/217; 437/219
[58] Field of Search ........................... 437/209, 211, 437/214, 217, 218, 219, 220

[56] References Cited

U.S. PATENT DOCUMENTS

| | | | |
|---|---|---|---|
| 5,353,498 | 10/1994 | Fillion et al. | 437/209 |
| 5,382,546 | 1/1995 | Yamada et al. | 437/209 |
| 5,383,269 | 1/1995 | Rathmell et al. | 437/209 |
| 5,409,865 | 4/1995 | Karnezos | 437/219 |

*Primary Examiner*—Kevin M. Picardat
*Attorney, Agent, or Firm*—Staas & Halsey

[57] ABSTRACT

A semiconductor device includes a flat package substrate having a main surface on which is defined a semiconductor chip mount surface portion and onto which a semiconductor chip is to be mounted and a peripheral surface portion surrounding the semiconductor chip mount surface portion. An electrically insulating elastic layer is provided on the peripheral surface portion of the flat package substrate and a wiring pattern film is provided on an exposed main surface of the elastic layer. The wiring pattern film includes a base insulting film and wiring patterns which are formed on the base insulation film, each wiring pattern having a first end connected to an external connection terminal and a second end connected to the semiconductor chip. The semiconductor chip is sealed with a resin by potting.

8 Claims, 3 Drawing Sheets

SEMICONDUCTOR DEVICE AND METHOD FOR MANUFACTURING SAME

BACKGROUND OF THE INVENTION

1. Field of the Invention

The present invention relates to a semiconductor device, a film used for manufacturing such a semiconductor device and manufacturing methods for the device and the film.

2. Description of the Related Art

Recently, semiconductor elements are very densely packaged. Accordingly, there is a demand for a semiconductor device having a large number of connection pins. As a semiconductor device suitable for packaging semiconductor elements very densely on a surface at low cost, the ball grid array (BGA) structure type semiconductor device has been investigated for practical use. Compared with a conventional semiconductor device, such as the quad flat package (QFP), the ball grid array structure is advantageous in that a large number of external connecting terminals can be arranged without increasing the density of lead arrangement, so that the yield is high in the actual packaging process.

However, in the conventional ball grid array structure type semiconductor device, the following problems may be encountered. Due to a difference between the thermal expansion coefficient of a mount substrate and that of a package substrate, a thermal stress is caused. Cracks are caused on the package substrate by this thermal stress and, further, the package substrate is deformed.

Usually, a substrate made of glass-epoxy is used for the mount substrate of the semiconductor device. The thermal expansion coefficient of the glass-epoxy substrate is approximately $15 \times 10^{-6}$/° C. For example, when the package substrate is made of alumina ceramics, the thermal expansion coefficient is approximately $7 \times 10^{-6}$/° C. When the package substrate is made of aluminum nitride ceramics, the thermal expansion coefficient is approximately $4 \times 10^{-6}$/° C. As described above, compared with the thermal expansion coefficient of the mount substrate, the thermal expansion coefficient of the package substrate is very small. Therefore, when ceramics are used for the package substrate, the thermal stress caused between the mount substrate and the semiconductor device cannot be neglected (i.e., ignored).

On the other hand, when plastics are used for the material of the package substrate, the thermal expansion coefficient of the package substrate can be made approximately the same as that of the actual packaging substrate. Due to the foregoing, both thermal expansion coefficients can be matched to each other. In this case, however, when the thermal expansion coefficient of the semiconductor chip is compared with the thermal expansion coefficient of the package substrate, the thermal expansion coefficient of the package substrate is much higher than that of the semiconductor chip. Accordingly, the thermal stress caused between the package substrate and the semiconductor chip is increased. Such a thermal stress becomes one of the problems.

Further, the following problems may be encountered. Since plastics are flexible to some extent, the package substrate is warped badly by the shrinkage caused in the process of resin molding. Furthermore, when plastics are used for the semiconductor device, the heat dissipation property is generally low. In order to solve the above problems, it is possible to employ a package substrate having a metallic core. However, when this type package substrate is employed, the manufacturing cost is very high.

In this connection, as a low cost surface mount type semiconductor device there is provided a tape carrier package (TCP). This is a simple semiconductor device composed in such a manner that a semiconductor chip is connected with a TAB tape and the semiconductor chip is sealed by means of potting. However, this TCP is disadvantageous in that the leads are easily deformed, so that the product is difficult to handle. In order to solve the above problem, the semiconductor chip is sealed in a wide area by means of potting, or alternatively, resin molding is conducted so as to provide a shape preserving property. However, this method is disadvantageous in that the heat dissipation property of the semiconductor device is deteriorated.

SUMMARY OF THE INVENTION

It is an object of the present invention to provide a semiconductor device, and a preferable manufacturing method thereof, characterized in that the structure of the semiconductor device is very simple; the manufacturing cost is reduced; it is possible to solve problems caused by a difference between the thermal expansion coefficient of a mount substrate and the thermal expansion coefficient of a package substrate; and the heat dissipating property is high.

Another object of the present invention is to provide a semiconductor device, and a manufacturing method thereof, in which the above-mentioned problems can be solved.

According to an aspect of the present invention, there is provided a semiconductor device comprising a package substrate having a surface defining a chip mount area and a peripheral area thereof; a semiconductor chip mounted on said chip mount area of the package substrate; an electrically insulating elastic layer provided on said peripheral area of the package substrate, said layer having an outside surface opposite to said package substrate; a wiring pattern film provided on said outside surface of the elastic Layer, said wiring pattern film including a base insulation film and wiring patterns formed on said base insulation film, each of said wiring patterns having one end connected with an external connection terminal and the other end connected with said semiconductor chip; and a resin sealant for sealing said semiconductor chip.

The external connection terminals are supported by the package substrate through an elastic layer. The elastic layer functions as a buffer layer to avoid the influence of thermal stress. Due to the foregoing, the thermal expansion coefficient of the package substrate is matched to that of the semiconductor chip, and the problems caused by the mount substrate and the package substrate can be solved.

Therefore, the semiconductor device of the present invention is characterized in that the structure is simplified; the handling of the semiconductor device is easy; and the number of pins can be easily increased. When the elastic layer is made of material having a rubber-elasticity, it is possible to preferably avoid the thermal stress caused between the package substrate and the actual packaging substrate, and further the thermal expansion coefficient of the semiconductor chip and that of the package substrate can be matched to each other, so that a bad influence caused by the thermal stress can be avoided.

In one embodiment, said base insulation film of the wiring pattern film includes at least one device hole and a plurality of joint holes at the periphery of said device hole; one end of each said wiring pattern being exposed in said respective joint holes and the other end of each said wiring pattern being extended into said device holes; and a face of said wiring pattern film on which said wiring patterns are formed is adhered to said outside surface of the elastic layer.

In another embodiment, said base insulation film of the wiring pattern film includes a plurality of joint holes one end of each said wiring pattern being exposed in said respective joint holes and the other end of each of said wiring patterns being connected to semiconductor chip connecting portion of said wiring pattern film; and a face of said wiring pattern film on which said wiring patterns are formed is adhered to said outside surface of the elastic layer.

Said elastic layer may be composed of an elastic body having rubber elasticity. In this connection, said elastic layer may be made of a silicon rubber or a rubber, a principal component thereof being silicon rubber.

Said package substrate may be formed flat, and said elastic layer has a thickness which is larger than a thickness of said semiconductor chip so as to form a cavity in which said semiconductor chip is located. Alternatively, said package substrate may have a cavity in which said semiconductor chip is located.

Said package substrate may be made of a selected one of aluminum nitride ceramic, silicon-carbide ceramic, alumina ceramic and mullite ceramic. Alternatively, said package substrate may be a selected one of copper, aluminum copper-aluminum alloy, iron-nickel alloy and iron-cobalt-nickel alloy.

Said base insulation film of the wiring pattern film may be made of polyimide or glass-epoxy.

Said external connection terminals may be solder balls. Alternatively, said external connection terminals may be lead pins which are adapted for insertion or surface mounting.

According to another aspect of the present invention, there is provided a method of manufacturing a semiconductor device comprising the steps of joining an elastic layer to a periphery of a semiconductor mount portion on a package substrate; joining a wiring pattern film, having a wiring pattern connected with a semiconductor chip, to an outside of said elastic layer; joining a back of said semiconductor chip to the package substrate; sealing said semiconductor chip by means of potting; and joining external connection terminals to respective ends of said wiring pattern on the wiring pattern film.

When the semiconductor device is manufactured, the elastic layer, wiring pattern film and semiconductor chip are positioned with respect to the package substrate and integrally joined to each other for assembly. Due to the foregoing, it is possible to manufacture the semiconductor chip very easily.

According to still another aspect of the present invention, there is provided a wiring pattern film adapted to be used for a semiconductor device, said wiring pattern film comprising a base insulation film having at least one device hole and a plurality of joint holes at the periphery of said device hole; and wiring patterns formed on said base insulation film, each said wiring pattern having one end exposed in said respective joint hole and the other end extended into said device hole.

According to still further aspect of the present invention, there is provided a wiring pattern film adapted to be used for a semiconductor device, said wiring pattern film comprising a base insulation film having a plurality of joint holes and defining a chip connecting area; and wiring patterns formed on said base insulation film, each said wiring pattern having one end exposed in said respective joint hole and the other end connected to said chip connecting area.

DETAILED DESCRIPTION OF THE PREFERRED EMBODIMENTS

With reference to the accompanying drawings, preferred embodiments of the present invention will be explained as follows.

Figure 1:
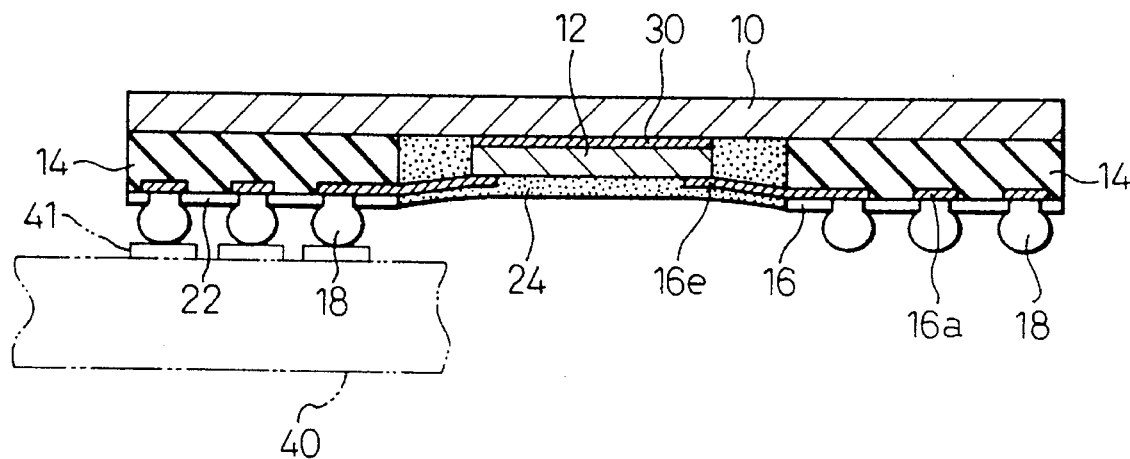
FIG. 1 is a schematic cross-sectional view showing the structure of an embodiment of the semiconductor device.

FIG. 1 is a cross-sectional view showing the structure of an embodiment of the semiconductor device of the present invention. The semiconductor device of this embodiment is structured as follows. A semiconductor chip 12 is mounted, by means of an adhesive 30, on one surface of a sheet-shaped package substrate 10 made of aluminum nitride ceramic. A silicon rubber sheet, which functions as an elastic layer 14, is attached onto the package substrate 10 in a region except for the portion where the semiconductor chip 12 is mounted. A wiring pattern film 16 is joined onto the outside (i.e., an exposed surface) of the elastic layer 14, i.e., the opposite side of the elastic layer 14 away from the package substrate 10. Further, solder balls, which function as external connection terminals 18, are joined onto wiring patterns 16a provided on the wiring pattern film 16. The semiconductor device thus made can be mounted on a mount substrate 40 as is well known in the prior art.

The package substrate 10 is composed of an aluminum nitride ceramic substrate, which is formed by means of powder forming and is fired in a nitrogen atmosphere at 1830° C. and subjected to surface oxidization processing at 1020° C. in the atmosphere. The package substrate may be formed by the green sheet method. However, it is possible to reduce the cost when the powder forming method is employed.

In this connection, the ceramic substrate used for the package substrate 10 is not limited to aluminum nitride ceramic, but silicon carbide ceramic, alumina ceramic and mullite ceramic can preferably be used. When the heat dissipation property of the semiconductor device is important, it is effective to use aluminum nitride ceramic or silicon carbide ceramic. When the manufacturing cost of the semiconductor device is important, it is effective to use alumina ceramic. Mullite ceramic is effective because the thermal expansion coefficient of mullite ceramic is approximately equal to that of the semiconductor chip made of silicon and further the cost is relatively low.

The package substrate 10 of the semiconductor device of this embodiment is simply flat. Therefore, the elastic layer 14 has an object of forming a cavity in which the semiconductor chip 12 mounted on the package substrate 10 is accommodated. For this reason, it is necessary that the elastic layer 14 is thicker than the semiconductor chip 12.

Figure 2:
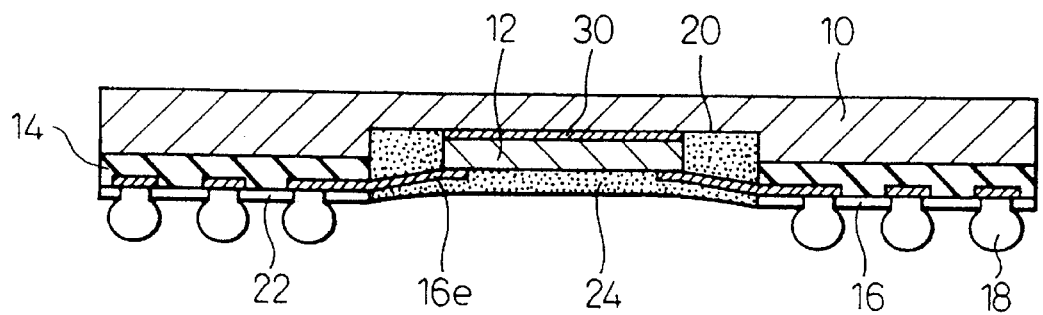
FIG. 2 is a schematic cross-sectional view showing the structure of another embodiment of the semiconductor device.

FIG. 2 shows an embodiment of the semiconductor device in which a cavity 20 is provided in the mount portion for the semiconductor chip 12 on the package substrate 10. Since the semiconductor chip 12 is accommodated in the cavity 20 in the semiconductor device of this embodiment, the thickness of the elastic layer 14 is advantageously reduced.

Since the wiring patterns 16a on the wiring pattern film 16 are joined onto the outside (i.e., exposed surface) of the elastic layer 14, it is necessary that the elastic layer 14 is provided with an electrically insulating property. Material of the elastic layer 14 is not limited to a specific material as long as it has a rubber elasticity; however, silicon rubber is preferably used. The reason is described as follows. When a silicon rubber sheet is used for the elastic layer 14, it is possible to provide both the electric insulating property and the rubber elasticity. The reason why the elastic layer 14 is given the rubber elasticity is described as follows. A thermal stress acts on the package substrate due to the difference between the thermal expansion coefficient of the actual packaging substrate onto which the semiconductor device is actually packaged, and the thermal expansion coefficient of the package substrate. This thermal stress can be avoided by the buffer effect of the elastic layer 14.

A silicon rubber sheet is rubber-elastic in a wide temperature range. Therefore, it is possible to use silicon rubber for the elastic layer 14 in the semiconductor device. Silicon rubber available on the market is provided with the rubber elasticity in the temperature range from −50° C. to 250° C. In this connection, the thermal expansion coefficient of silicon rubber is $10^{-4}/°$ C., which is so high that a filler having a low thermal expansion coefficient may be added to silicon rubber when necessary so as to reduce the thermal expansion coefficient. A fine powder of amorphous silica is preferably used for the filler. In this embodiment, silicon rubber was used, the principal component of which was silicon added in such a manner that molten silica powder, the average particle size of which was approximately 0.3 μm, was added into the rubber in an amount of about 20 volume percent.

The elastic layer 14 is attached onto the package substrate 10 in such a manner that an elastic sheet having a through-hole formed in a region where the semiconductor chip 12 is mounted is adhered onto the package substrate 10 using adhesive 30. In this embodiment, a silicon rubber compound, which had not hardened, was coated on both sides (i.e., exposed surface) of a rectangular silicon rubber sheet of 0.55 mm thickness, and the silicon rubber sheet was adhered onto the package substrate 10, so that the elastic layer 14 was formed.

The wiring pattern film 16 was joined onto the outside (i.e., exposed surface) of the resilient layer 14, so that the external connection terminals 18, joined to the wiring patterns 16a, were electrically connected with the semiconductor chip 12. In this embodiment, after the wiring pattern film 16 had been previously connected with the semiconductor chip 12, a face (i.e., surface) of the wiring pattern film 16 on which the wiring patterns 16a were formed was joined to the elastic layer 14.

In this connection, instead of a method in which the wiring pattern film 16 is joined onto the elastic layer 14 after the elastic layer 14 has previously been joined onto the package substrate 10, it is possible to employ a method in which the elastic layer 14 and the semiconductor chip 12 are joined onto the package substrate 10 after the wiring pattern film 16 has been joined onto the elastic layer 14. The elastic layer 14 may be adhered by a coating of a silicon rubber compound.

The wiring pattern film 16 can be made by the same method as that of manufacturing a three-layer-TAB-tape or two-layer-TAB-tape.

Figure 3A:
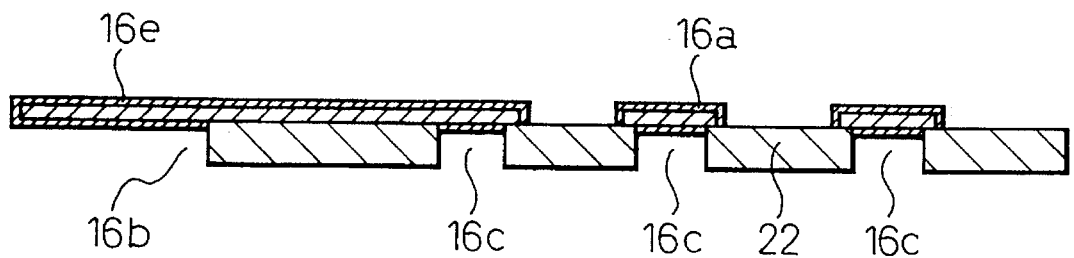
FIGS. 3(a) and 3(b) are cross-sectional view and a plan view, respectively, showing the structure of a wiring pattern film.
Figure 3B:
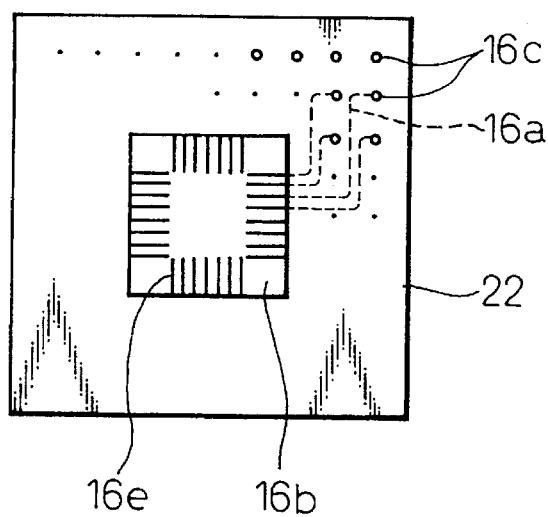

FIG. 3(a) is a cross-sectional view showing a portion of the wiring pattern film 16 and FIG. 3(b) is a plan view thereof. The wiring pattern film 16 is structured in such a manner that the wiring patterns 16a are provided on one main surface of an electrically insulating base film 22. The wiring patterns 16a can be formed by etching a metallic foil attached onto the one main surface of the base film 22. Copper foil is most appropriate, for use as the metallic foil to form the wiring patterns 16a, from the viewpoint of reduction of the manufacturing cost and also from the viewpoint of providing the necessary characteristics, such as a possibility of making very fine patterns. It is common to use a piece of electrolytic copper foil, the thickness of which is 17 μm to 70 μm.

The base film 22 includes a device hole 16b for accommodating the semiconductor chip 12, and joint holes 16c for joining the external connection terminals 18. The base film 22 is made of polyimide or glass epoxy. It is preferable to use polyimide having a good heat-resistant property. It is preferable to use a base film, the thickness of which is 50 μm to 125 μm and, more preferably, 75 μm to 120 μm. One end of each of the wiring patterns 16a to which the external connection terminals are joined, is exposed into the respective joint holes 16c. The other end of each of the wiring patterns 16a forms a connection lead 16e extended into the device hole 16b so that the connection lead 16e can be connected with the semiconductor chip 12.

In the embodiment, the connection leads 16e are nickel-plated and gold-plated. The connection leads 16e are then subjected to single-point-bonding so as to be connected with a semiconductor chip 12 having connection bumps.

In this embodiment, it is preferable that, after a semiconductor chip 12 is mounted on and connected to the wiring patterns 16a of the wiring pattern film 16, the semiconductor chip 12 is subjected to a quality check, such as an electrical test for element, to determine whether the semiconductor chip 12 is acceptable or unacceptable. In this case, the wiring pattern film 16 is used as a carrier base for the test and the portions of the wiring patterns 16a, extending from the base film 22, are connected to terminals of the test unit (not shown).

Thus, only the acceptable semiconductor chips mounted on the wiring pattern films 16, among many chips mounted on such films, can be used for making a semiconductor package.

Also, since the wiring pattern film 16, on which the semiconductor chip 12 is already mounted and subjected to test, is directly used for making a semiconductor device, it is no longer necessary to mount the semiconductor chip on a special element carrier for purposes test and of the to remove the chip from such a carrier.

In this embodiment, the wiring pattern film 16 and the elastic layer 14 made of a silicon rubber sheet are joined by silicon rubber compound, and the elastic layer 14 and the package substrate 10 are also joined by a silicon rubber compound. However, the semiconductor chip 12 and the package substrate 10 are joined by the adhesive 30 of silver epoxy. Actually, after the silicon rubber sheet, which served as the elastic layer 14, had been joined to the package substrate 10, the silicon rubber sheet and the wiring pattern film 16 were positioned contacting each other, and also the semiconductor chip 12 and the package substrate 10 were positioned contacting each other, and while a light load was imposed by the fixture, they were cured at the temperature of 150° C. so as to be integrated into one body.

When the semiconductor chip 12 and the package substrate 10 are joined to each other and the package substrate 10 is made of ceramic, it is preferable that they are joined by solder made of gold-tin (gold 80% -tin 20%), because the heat resistance of solder made of gold-tin is low and the processing temperature is approximately 280° C., which is advantageous in conducting the manufacturing process. However, when solder made of gold-tin is used, it is necessary that the ceramic substrate is metalized, and aluminum nitride ceramic or mullite ceramic, the thermal expansion coefficients of which are low, are preferably used. A silver epoxy adhesive or a silver polyimide adhesive is preferably used without metalizing the ceramic substrate.

After the semiconductor chip 12 has been mounted on the package substrate 10, the semiconductor chip 12 is hermetically sealed by a potting method. Bisphenol epoxy resin or silicon rubber is preferably used for the potting material. Reference numeral 24 is a potting material. When a material having a rubber-elasticity character is used for the elastic layer 14, it is preferable to use a two-liquid type silicon rubber. In this embodiment, the device hole 16b accommodating the semiconductor chip 12 or the cavity 20 was subjected to potting using the potting material of silicon rubber, and then the potting material was cured at 150° C. so as to be sealed.

After that, the external connection terminals 18 are joined to the wiring pattern film 16, so that the semiconductor device is completed.

In the embodiment, solder balls were used for the external connection terminals 18. Accordingly, a tin-lead ball was arranged in each joint hole 16c on the wiring pattern film 16, and the solder was melted at about 230° C. so as to join (i.e., connect) the solder ball. In this case, the base film 22 of the wiring pattern film 16 functioned as a solder registration, so that solder balls each having a preferable shape could be formed.

Of course, it is possible that lead pins or stud bumps, for insertion use or surface mount use, may be used instead of the solder balls.

Figure 4:
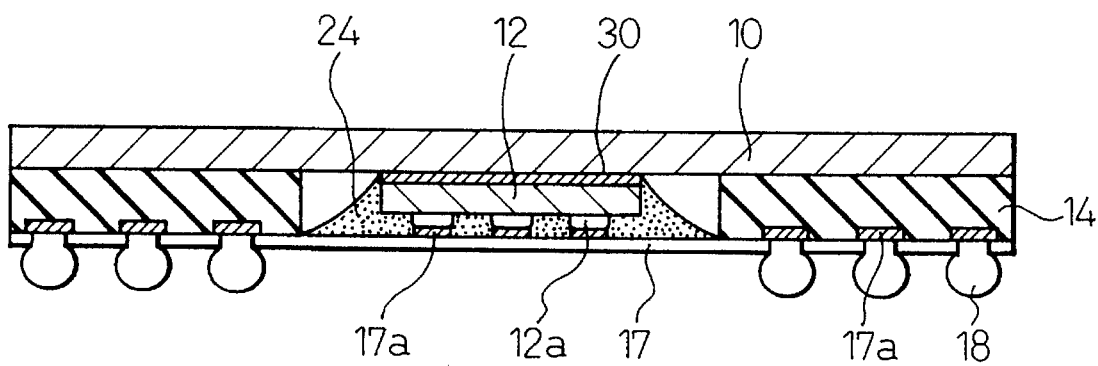
FIG. 4 is a schematic cross-sectional view showing the structure of still another embodiment of the semiconductor device.

On the wiring pattern film 16 used in the semiconductor device of the above embodiment, the device hole 16b was formed so as to accommodate the semiconductor chip 12. However, it is possible to use a wiring pattern film 17 having no device hole, as shown in FIG. 4. Concerning each wiring pattern 17a of the wiring pattern film 17 of this embodiment, one end can be connected to the external connection terminal 18, and the other end is connected to the connecting portions, i.e., the connection bumps, of the semiconductor chip 12.

When the semiconductor chip 12 is mounted on the package substrate 10, the semiconductor chip 12 is connected with the wiring patterns 17a by the solder bumps 12a, and after the periphery of the semiconductor chip 12 has been subjected to potting using the potting material, the wiring pattern film 17 is joined to the elastic layer 14 previously joined to the package substrate 10, so that the semiconductor chip 12 is joined onto the package substrate 10. After that, the external connection terminals 18 are joined onto the wiring pattern film 17. In this way, the semiconductor device is completed.

In the same manner as the embodiments shown in FIGS. 1 and 2, it is also possible that, after a semiconductor chip 12 is mounted on and connected to the wiring patters 17a and subjected to an electrical test for element, the semiconductor chip can be mounted on the package. In this case, the sealing resin 24 may be provided after the semiconductor chip 12 is connected to the wiring patterns 17a or after the semiconductor chip 12 is mounted on the package.

Figure 5:
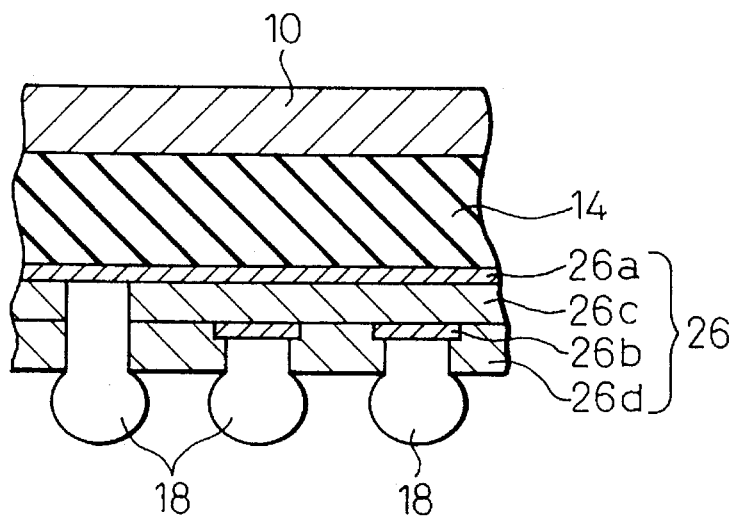
FIG. 5 is a partial cross-sectional view showing the structure of another wiring pattern film.

On the wiring pattern film used in the respective embodiment, an individual conductive layer is provided as each of the wiring patterns 16a or 17a; however, it is also possible to provide not less than 2 conductive layers as each wiring pattern or as each ground layer. FIG. 5 shows an example in which a wiring pattern film 26 having two conductive layers is used. This wiring pattern film 26 includes: a conductive layer 26a used as a ground layer; a wiring pattern layer 26b for electrically connecting the external connection terminals 18 with the semiconductor chip 12; an insulation base film 26c; and a solder registration 26d. The solder registration 26d is made of the same material as that of the insulation base film 26c.

When the conductive layer 26a, used as a ground layer, is provided separately from the wiring patterns 26b, it is possible to conduct impedance matching of the wiring pattern and also it is possible to prevent the occurrence of cross-talk. Due to the foregoing, it is possible to improve the high frequency characteristic of the semiconductor device. When the ground layer of the conductive layer 26a is made to be a wiring pattern, the number of pins of the semiconductor device can be further increased.

The semiconductor device shown in the respective embodiment is a product of simple structure in which the semiconductor chip 12 is mounted on one side (i.e., main surface) of the package substrate 10 and sealed by means of potting. The package substrate 10 is simply flat, or alternatively only a recess for accommodating the semiconductor chip 12 is formed on the package substrate 10, that is, the package substrate 10 is very simple. The semiconductor chip 12 and the external connection terminals 18 are electrically connected by the wiring patterns 16a provided on the wiring pattern film 16. The substrate surface on which the semiconductor chip 12 is mounted can be effectively used for the external connection terminals 18. Therefore, it is possible for the structure of the present invention to be adapted to a case in which the number of pins is increased.

According to the present invention, it is possible to reduce the thickness of the semiconductor device. Therefore, the semiconductor device can be made compact. Further, a shape preserving property can be provided by the package substrate 10. Accordingly, the semiconductor device of the present invention is convenient during the packaging process in manufacturing.

When the package substrate 10 is made of ceramics having a high heat dissipation property, such as aluminum nitride ceramics, it is possible to provide a semiconductor device having a high heat dissipation property. In this connection, the material of the package substrate 10 is not limited to the ceramics described above, but other materials may be used. Examples of other usable materials are metals excellent in heat conduction such as copper, aluminum, copper-aluminum alloy, iron-nickel alloy, and iron-cobalt-nickel alloy.

When the elastic layer 14 is made of material having a rubber-elasticity such as silicon rubber, it is possible to solve the problem of thermal stress caused by a difference between the thermal expansion coefficient of the package substrate 10 and the thermal expansion coefficient of the actually packaging substrate, so that the semiconductor device is not affected by thermal stress. Due to the foregoing, it is possible to provide a semiconductor device in which the thermal expansion coefficient of the package substrate 10 is matched to that of the semiconductor chip 12, so that the problem caused by the thermal stress can be solved.

We claim:

1. A method of manufacturing a semiconductor device, comprising the steps of:

defining, on a main surface of a flat package substrate, a semiconductor chip mount portion having a periphery and a peripheral surface portion of the main surface extending about and outwardly from the periphery of the semiconductor chip mount portion;

joining an elastic layer to the peripheral surface portion of the main surface of the flat package substrate, said elastic layer having a thickness larger than a thickness of a semiconductor chip to be mounted on the semiconductor chip mount portion and having an inner wall surrounding, and at least in part defining, a cavity encompassing the semiconductor chip mount portion;

joining a wiring pattern film, having wiring patterns for connection with said semiconductor chip, to an exposed surface of said elastic layer;

positioning a semiconductor chip within said cavity and joining a back surface of said semiconductor chip to the semiconductor chip mount portion of the main surface of the flat package substrate;

sealing said semiconductor chip within said semiconductor device by potting same in a potting material; and joining external connection terminals to respective ends of said wiring patterns on the wiring pattern film.

2. A method of manufacturing a semiconductor device as set forth in claim 1, further comprising the steps of:

forming joint holes and a device hole in an insulating base film of the wiring pattern film:

forming wiring patterns on said base film in such a manner that a first end of each wiring pattern is exposed at a respective joint hole and a second end thereof extends into said device hole of the wiring pattern film; and joining a surface of said wiring pattern film, on which the wiring pattern is formed, to the exposed surface of the elastic layer.

3. A method of manufacturing a semiconductor device as set forth in claim 1, further comprising the steps of:

forming joint holes in an insulating base film of the wiring pattern film;

forming wiring patterns on the base film in such a manner that a first end of each wiring pattern is exposed in a respective joint hole and a second end thereof is connected to the semiconductor chip connecting portion of the wiring pattern film; and joining a surface of said wiring pattern film, on which the wiring pattern is formed, to the exposed surface of the elastic layer.

4. A method of manufacturing a semiconductor device comprising the steps of:

mounting a semiconductor chip on a wiring pattern film having wiring patterns thereon so that the semiconductor chip is electrically connected to the wiring patterns;

conducting a test of the wiring pattern film, on which the semiconductor chip is mounted, to determine whether the semiconductor chip is acceptable or unacceptable;

joining an elastic layer to the peripheral surface portion of the main surface of the flat package substrate, said elastic layer having a thickness larger than a thickness of a semiconductor chip to be mounted on the semiconductor chip mount portion and having an inner wall surrounding, and at least in part defining, a cavity encompassing the semiconductor chip mount portion;

selecting a wiring pattern film associated with, and having the wiring patterns thereof connected to, an acceptable semiconductor chip, and joining the selected wiring pattern film to the exposed surface of said elastic layer;

positioning said semiconductor chip within said cavity and joining a back surface of said semiconductor chip to the semiconductor chip mount portion of the main surface of the flat package substrate;

sealing said semiconductor chip within said semiconductor device by potting same in a potting material; and joining external connection terminals to respective first ends of said wiring pattern on the wiring pattern film.

5. A method of manufacturing a semiconductor device, comprising the steps of:

preparing an elastic layer and a wiring pattern film, the elastic layer having a thickness larger than a thickness of a semiconductor chip and the wiring pattern film comprising an insulating base film having first and second main surfaces and wiring patterns formed on the first main surface of the insulating base film;

joining the elastic layer to the first main surface of the insulating base film of the wiring pattern film, the elastic layer having an inner wall surrounding, and thereby defining, a cavity and an exposed main surface;

providing a flat package substrate having a main surface on which is defined a semiconductor chip mount portion and a peripheral surface portion surrounding the semiconductor chip mount portion;

joining the elastic layer to the peripheral surface portion of the main surface of said flat package substrate and such that the cavity therein surrounds and extends peripherally about the semiconductor chip mount portion of said main surface of said flat package substrate;

positioning a semiconductor chip within the cavity and joining a back surface of the semiconductor chip to the main surface of the flat package substrate, within the cavity;

sealing said semiconductor chip by potting; and joining external connection terminals to respective ends of the wiring patterns of the wiring pattern film.

6. A method of manufacturing a semiconductor device as set forth in claim 5, further comprising the steps of:

forming joint holes and a device hole in the insulating base film of the wiring pattern film;

forming the wiring patterns on said insulating base film in such a manner that a first end of each wiring pattern is exposed at a respective joint hole and a second end thereof extends into said device hole of the wiring pattern film; and joining the first main surface of the insulating base film, of said wiring pattern film and on which the wiring pattern is formed, to the exposed main surface of the elastic layer.

7. A method of manufacturing a semiconductor device as set forth in claim 5, further comprising the steps of:

forming joint holes on an insulating base film of the wiring pattern film;

forming wiring patterns on the insulating base film in such a manner that a first end of each wiring pattern is exposed in a respective joint hole and a second end thereof is connected to the semiconductor chip connecting portion of the wiring pattern film; and joining a surface of the wiring pattern film, on which the wiring pattern is formed, to the exposed main surface of the elastic layer.

8. A method of manufacturing a semiconductor device, comprising the steps of:

mounting a semiconductor chip on a wiring pattern film, having wiring patterns thereon, so that the semiconductor chip is electrically connected to the wiring patterns;

conducting a test of the wiring pattern film, on which the semiconductor chip is mounted, to determine whether the semiconductor chip is acceptable or unacceptable;

joining an elastic layer to a surface of the wiring pattern film on which said wiring patterns are formed, the elastic layer having a thickness larger than a thickness of the semiconductor chip and an inner wall surrounding, and at least in part defining, a cavity;

defining, on a main surface of a flat package substrate, a semiconductor chip mount portion, having a periphery, and a peripheral surface portion on the main surface extending about and outwardly from the periphery of the semiconductor chip mount portion;

joining the elastic layer to the peripheral surface portion of the main surface of the flat package substrate and with the cavity therein surrounding the semiconductor chip mount portion of the flat package substrate;

positioning the semiconductor chip within the cavity and joining a back surface of the semiconductor chip to the semiconductor chip mount portion of the main surface of the flat package substrate;

sealing said semiconductor chip by potting; and joining external connection terminals to respective first ends of the wiring patterns on the wiring pattern film.

* * * * *

UNITED STATES PATENT AND TRADEMARK OFFICE
CERTIFICATE OF CORRECTION

PATENT NO. : 5,602,059
DATED : Feb. 11, 1997
INVENTOR(S) : HORIUCHI et al.

It is certified that error appears in the above-indentified patent and that said Letters Patent is hereby corrected as shown below:

Col. 2, line 38, change "Layer" to --layer--.

Col. 3, line 6, after "holes" insert --,--;
line 26, after "may be" insert --made of--.

Col. 5, line 49, change "(i.e., exposed surface)" to --(i.e., on both opposite surfaces)--.

Col. 6, line 29, after "16a" insert --,--;
line 58, change "test and of the" to --of the test and then--.

Signed and Sealed this

Twenty-fourth Day of June, 1997

Attest:

BRUCE LEHMAN

*Attesting Officer*     *Commissioner of Patents and Trademarks*